(12) United States Patent  (10) Patent No.: US 8,859,367 B2
Mathew et al.                (45) Date of Patent:    Oct. 14, 2014

(54) GATE CONSTRUCTIONS OF RECESSED ACCESS DEVICES AND METHODS OF FORMING GATE CONSTRUCTIONS OF RECESSED ACCESS DEVICES

(75) Inventors: Suraj Mathew, Boise, ID (US); Jaydip Guha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 581 days.

(21) Appl. No.: 12/833,071

(22) Filed: Jul. 9, 2010

(65) Prior Publication Data

US 2012/0009772 A1    Jan. 12, 2012

(51) Int. Cl.
| H01L 21/336 | (2006.01) |
| H01L 27/108 | (2006.01) |
| H01L 29/423 | (2006.01) |
| H01L 29/66  | (2006.01) |
| H01L 29/78  | (2006.01) |
| H01L 21/28  | (2006.01) |

(52) U.S. Cl.
CPC .... *H01L 29/66553* (2013.01); *H01L 27/10894* (2013.01); *H01L 29/4236* (2013.01); *H01L 29/42376* (2013.01); *H01L 29/66621* (2013.01); *H01L 29/78* (2013.01); *H01L 21/28114* (2013.01); *H01L 27/10876* (2013.01)
USPC ........... 438/270; 257/330; 257/E21.419; 438/259

(58) Field of Classification Search
USPC ............. 438/259, 261, 589, 242, 595, 270; 257/330–333, E21.655
See application file for complete search history.

(56) References Cited

U.S. PATENT DOCUMENTS

| 6,063,669 | A   | 5/2000  | Takaishi |
| 6,168,996 | B1  | 1/2001  | Numazawa et al. |
| 6,214,670 | B1  | 4/2001  | Shih et al. |
| 6,235,639 | B1  | 5/2001  | Sandhu et al. |
| 6,744,097 | B2  | 6/2004  | Yoo |
| 6,825,093 | B2* | 11/2004 | Scholz .......................... 438/386 |
| 6,884,679 | B2* | 4/2005  | Park et al. ..................... 438/257 |
| 7,022,573 | B2* | 4/2006  | Hsiao et al. ................... 438/259 |
| 7,122,429 | B2  | 10/2006 | Kito |
| 7,576,389 | B2* | 8/2009  | Tanaka ........................ 257/330 |
| 7,589,995 | B2  | 9/2009  | Tang et al. |
| 7,700,441 | B2  | 4/2010  | Kim et al. |
| 7,902,028 | B2  | 3/2011  | Kim et al. |
| 2004/0092115 | A1 | 5/2004  | Hsieh et al. |
| 2004/0224476 | A1 | 11/2004 | Yamada et al. |
| 2006/0113588 | A1* | 6/2006 | Wu .............................. 257/330 |
| 2007/0264771 | A1 | 11/2007 | Ananthan et al. |
| 2008/0128800 | A1 | 6/2008  | Song et al. |

(Continued)

OTHER PUBLICATIONS

Tran et al., "A 58nm Trench DRAM Technology", IEEE Xplore, Apr. 19, 2010, 4 pgs.

*Primary Examiner* — Matthew W Such
*Assistant Examiner* — Ali Naraghi
(74) *Attorney, Agent, or Firm* — Wells St. John, P.S.

(57) ABSTRACT

A method of forming a gate construction of a recessed access device includes forming a pair of sidewall spacers laterally over opposing sidewalls of a gate dielectric and elevationally over first conductive gate material. The gate dielectric, the first conductive gate material, and the sidewall spacers are received within a trench formed in semiconductive material. Second conductive gate material is deposited within the semiconductive material trench between the pair of sidewall spacers in electrical connection with the first conductive gate material. Other implementations are disclosed, including recessed access device gate constructions independent of method of manufacture.

21 Claims, 17 Drawing Sheets

(56) References Cited

U.S. PATENT DOCUMENTS

| | | |
|---|---|---|
| 2008/0242024 A1 | 10/2008 | Sugioka |
| 2009/0026522 A1 | 1/2009 | Ananthan |
| 2009/0173994 A1* | 7/2009 | Min et al. ...................... 257/330 |

\* cited by examiner

US 8,859,367 B2

GATE CONSTRUCTIONS OF RECESSED ACCESS DEVICES AND METHODS OF FORMING GATE CONSTRUCTIONS OF RECESSED ACCESS DEVICES

TECHNICAL FIELD

Embodiments disclosed herein pertain to gate constructions of recessed access devices and to methods of forming gate constructions of recessed access devices.

BACKGROUND

Embodiments of the invention were motivated in addressing current leakage that occurs in recessed access devices. A recessed access device is a field effect transistor having its gate construction received within a trench formed in semiconductive material. The gate construction includes a gate dielectric which lines the trench and conductive gate material received within the trench laterally inward of the gate dielectric. Source/drain regions are formed within the semiconductive material on opposing sides of the trench in outermost regions of the semiconductive material. Application of suitable voltage to the conductive gate material within the trench enables current to flow through the semiconductive material between the source/drains along the trench sidewalls and around the base of the trench.

Gate induced drain leakage (GIDL) is a negative attribute associated with field effect transistors, and can be problematic with recessed access devices, particularly at the elevationally outermost regions of the source/drains adjacent the uppermost portions of the trench.

DETAILED DESCRIPTION OF EXAMPLE EMBODIMENTS

Embodiments of the invention encompass methods of forming a gate construction of a recessed access device. The discussion initially proceeds with reference to FIGS. 1-9 of an example method of forming recessed access device gate constructions within a memory array area and forming peripheral circuitry gate constructions in a peripheral circuitry area.

Figure 1:
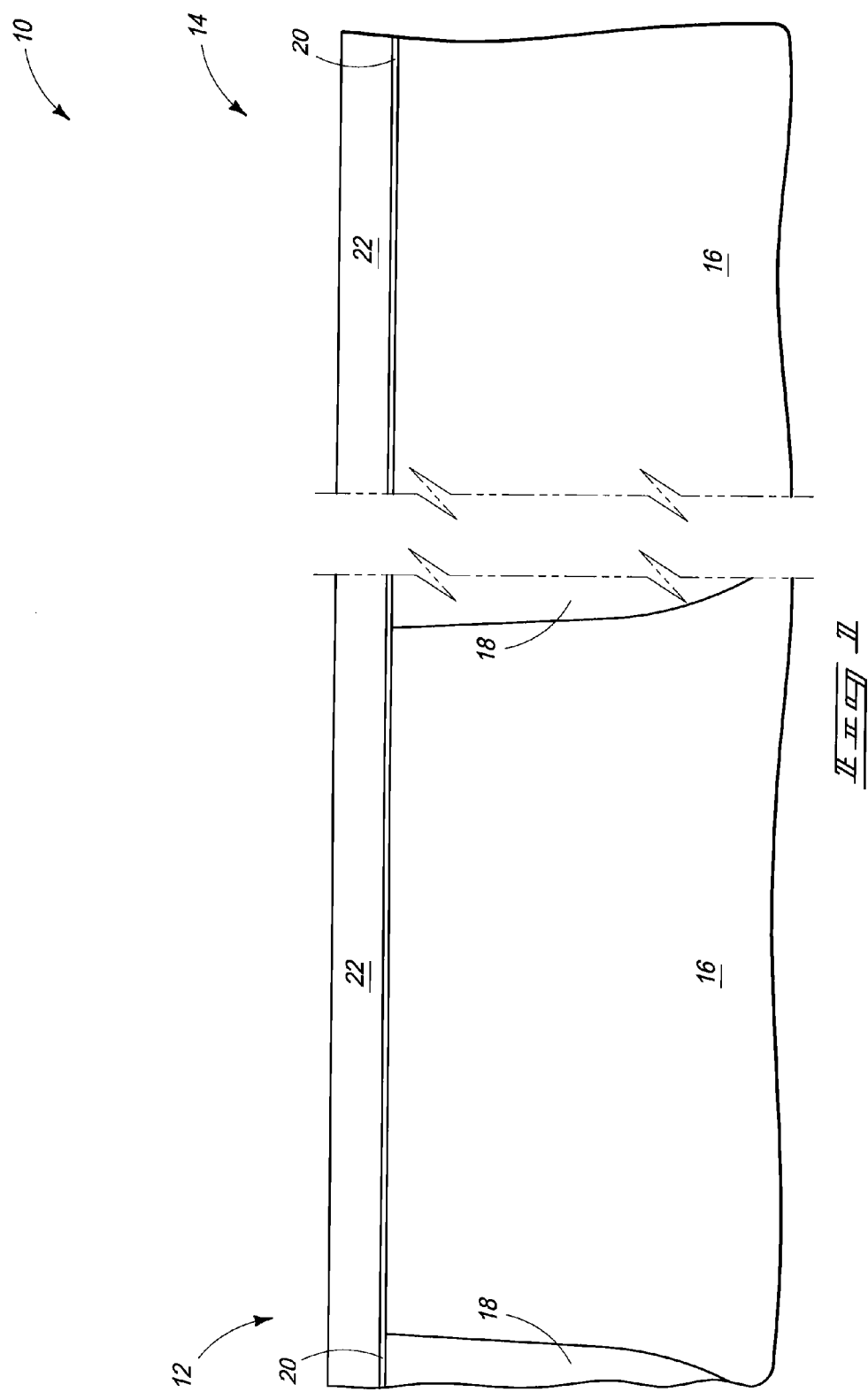
FIG. 1 is a diagrammatic sectional view of a substrate fragment in process in accordance with an embodiment of the invention.

Referring to FIG. 1, a semiconductor substrate 10 includes a memory array area 12 and a peripheral circuitry area 14. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 may comprise semiconductive material 16, for example monocrystalline silicon having trench isolation regions 18 formed therein. Active area of material 16 for device fabrication, for example field effect transistors, is received between or surrounded by trench isolation regions 18. Example trench isolation material is silicon dioxide which may be lined with silicon nitride. A sacrificial oxide 20 has been formed over substrate material 16/18, and photoresist-comprising material 22 has been formed thereover.

Figure 2:
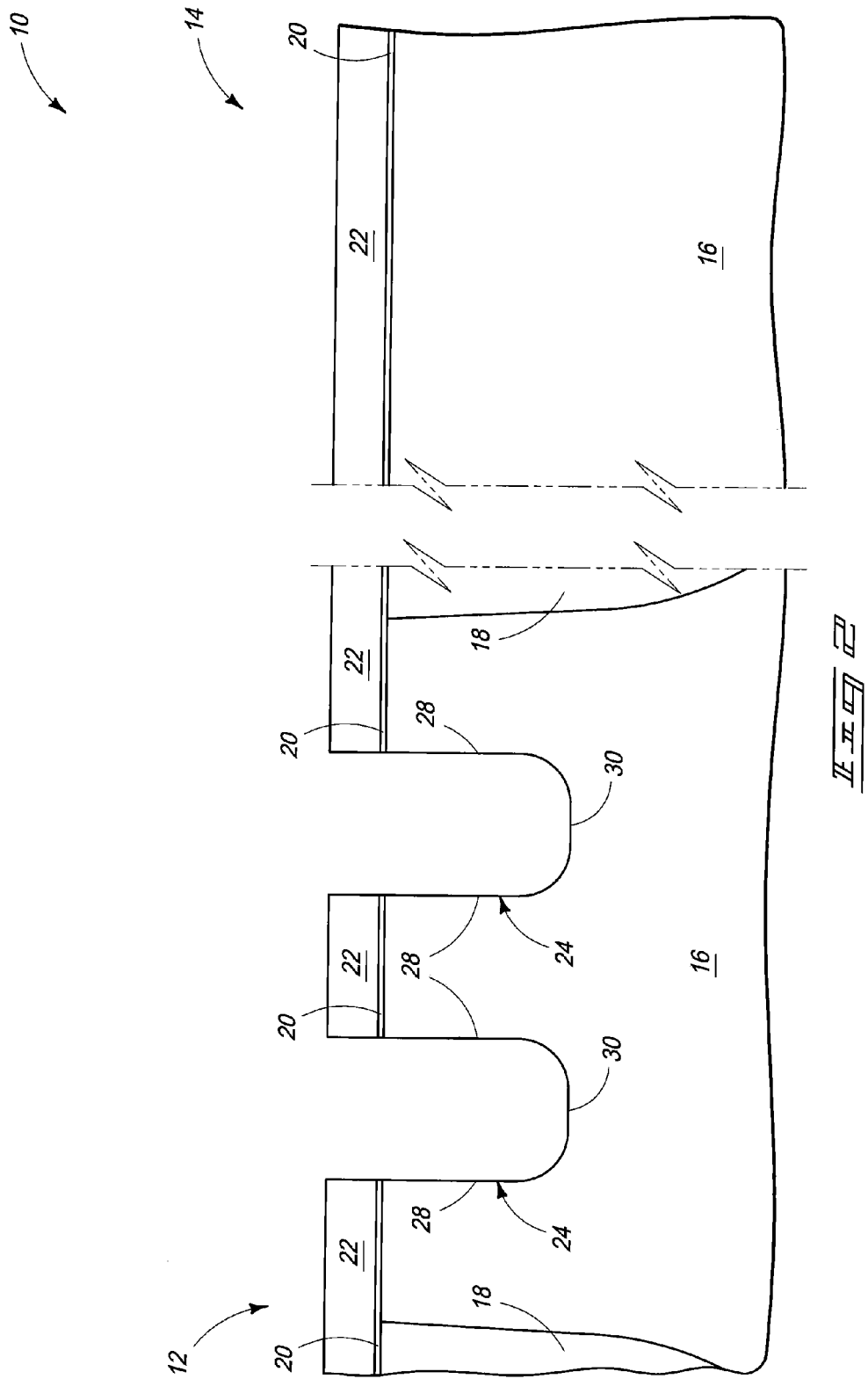
FIG. 2 is a view of the FIG. 1 substrate at a processing step subsequent to that shown by FIG. 1.

Referring to FIG. 2, photoresist-comprising material 22 has been patterned to form elongated trench openings therein. Material 22 has then been used as an etch mask in etching into material 20/16 in forming recessed access device trenches 24 within semiconductive material 16 within memory array area 12. Such trenches may also be formed in peripheral circuitry area 14 which, however, is not germane to embodiments of the invention. Trench openings (not shown) may also be formed through materials 22 and 20 into trench isolation 18. Trenches 24 would likely be elongated in a longitudinal direction into and out of the plane of the page upon which FIG. 2 lies. The respective recessed access device trenches may be considered as having opposing semiconductive material sidewalls 28 and a semiconductive material base 30 extending there-between. The discussion proceeds with example fabrication of dynamic random access memory (DRAM) circuitry, although any circuitry may be fabricated. Further, the above-described processing implies use of photoresist and photolithography, although recessed access device trenches 24 may be formed by any other existing or yet-to-be-developed process.

Figure 3:
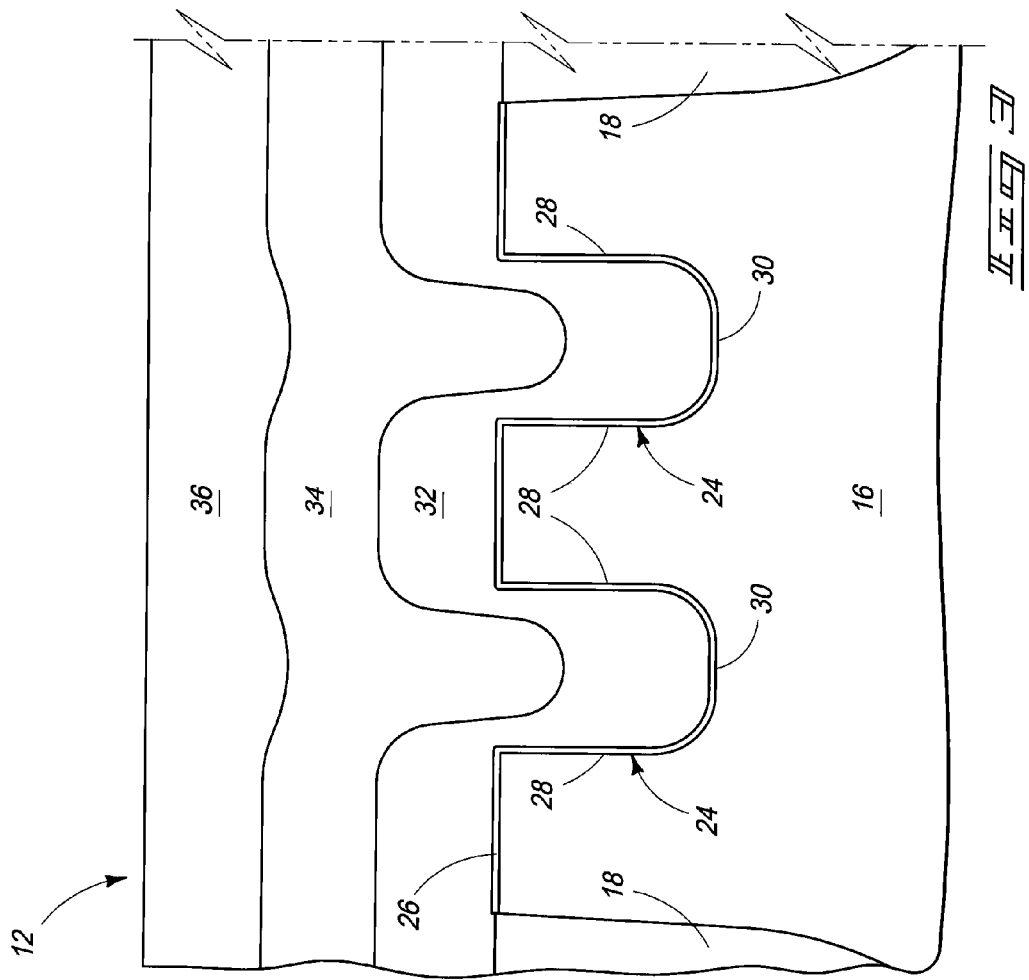
FIG. 3 is a view of the FIG. 2 substrate at a processing step subsequent to that shown by FIG. 2.

Referring to FIG. 3, oxide 20 (not shown) and photoresist-comprising material 22 (not shown) have been removed from the substrate. Thereafter, gate dielectric 26 has been formed over semiconductive material sidewalls 28 within trenches 24 in memory array area 12 and over semiconductive material 16 within peripheral circuitry area 14. Such may be homogenous or non-homogenous and comprise any suitable dielectric material, with thermally grown silicon dioxide being an example. Further, such may be subjected to plasma nitridation processing, or other processing, during or after its deposition. Any suitable thickness may be used, with from about 80 Angstroms to about 100 Angstroms being an example.

First conductive gate material 32 has been deposited over gate dielectric 26 within semiconductive material trenches 24 in memory array area 12 and over gate dielectric 26 in peripheral circuitry area 14. Material 32 may be deposited to physically contact gate dielectric 26. Material 32 may be homogenous or non-homogenous, and may comprise any one or combination of elemental metals, alloys of elemental metals, conductive metal compounds, and/or conductively doped semiconductive material. Conductively doped polysilicon is one example. An example thickness for first conductive gate material 32 is about half of an ultimate desired thickness of the conductive portions of gate constructions in the peripheral circuitry area where gate constructions are to be there-fabricated. An example thickness range is from about 250 Angstroms to about 450 Angstroms, with about 350 Angstroms being a specific example. In one embodiment, an etch barrier 34 may be deposited over first conductive gate material 32 in memory array area 12 and in peripheral circuitry area 14. An example material is silicon nitride deposited to an example thickness of about 300 Angstroms. Such may be used to protect the outermost surface of first conductive gate material 32 within peripheral circuitry area 14 during processing specific to memory array area 12. In one embodiment, a photoresist-comprising material 36 may be formed over etch barrier 34. Such may be homogenous or non-homogenous comprising multiple different composition materials and/or layers.

Figure 4:
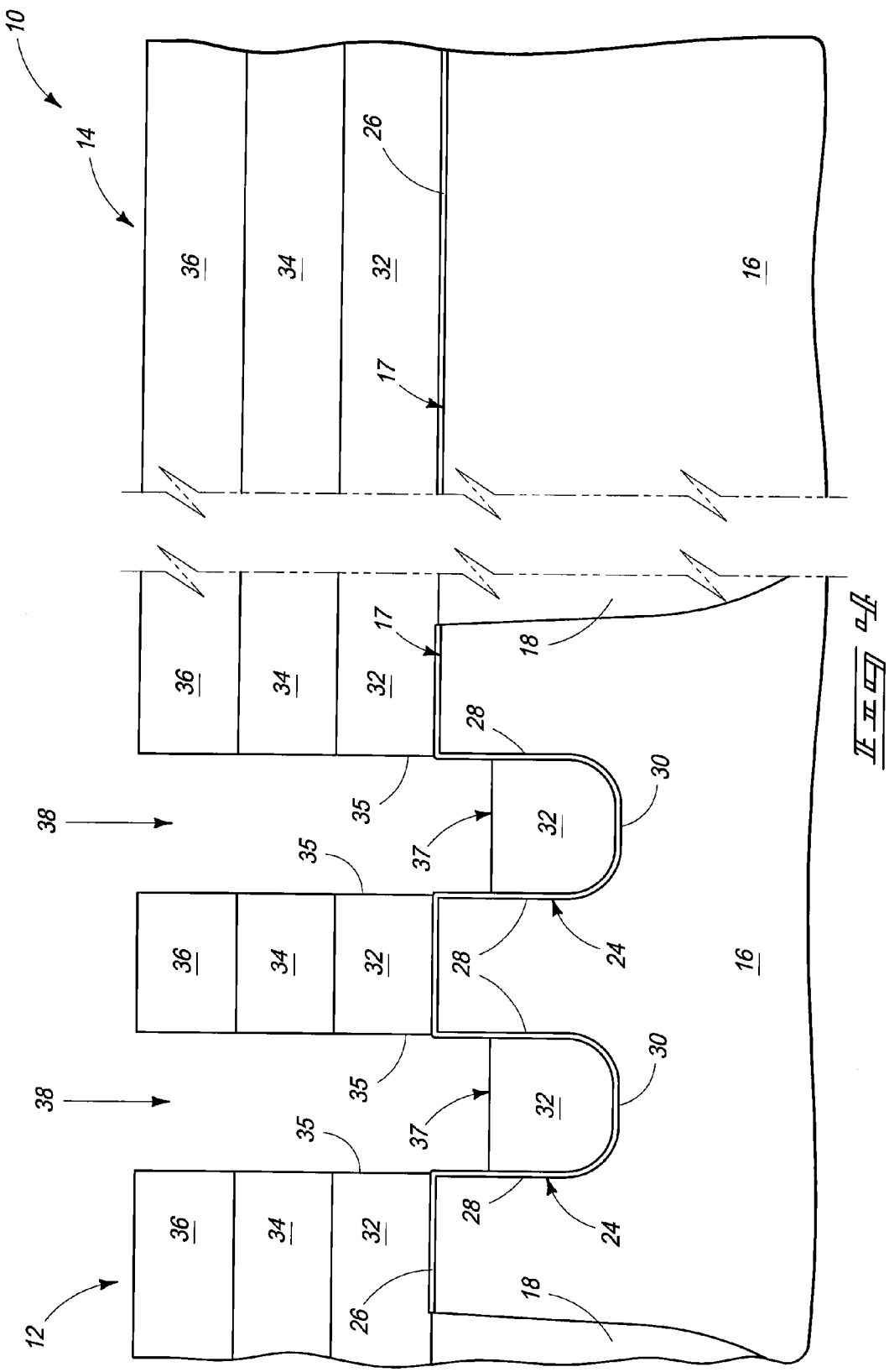
FIG. 4 is a view of the FIG. 3 substrate at a processing step subsequent to that shown by FIG. 3.

Referring to FIG. 4, photoresist-comprising material 36 has been patterned to form a mask having openings therethrough, with such mask being used to etch trench openings 38 through first conductive gate material 32 over recessed access device trenches 24 within memory array area 12. Trench openings 38 may be of the same size and configuration of trench openings 24 which were formed within material 16. Trench openings 38 may be considered as having opposing sidewalls 35 of first conductive gate material 32. Regardless, first conductive gate material 32 has been recessed within trenches 24, for example by etching, to expose sidewalls of elevationally outermost portions of gate dielectric 26 within semiconductive material trenches 24 in memory array area 12. In one embodiment, first conductive gate material 32 within respective recessed access device trenches 24 has a planar elevationally outermost (upper) surface 37 that spans completely across the respective trench 24 between gate dielectric 26 elevationally inward of an outermost surface 17 of semiconductive material 16 immediately adjacent the respective trenches 24. In one embodiment, surface 37 of the first conductive gate material within the respective trenches 24 is recessed from about 200 Angstroms to about 500 Angstroms from surface 17. In one embodiment, surface 37 within the respective trenches 24 is recessed from about 200 Angstroms to about one-third of the depths of trenches 24 within material 16 from surface 17.

Figure 5:
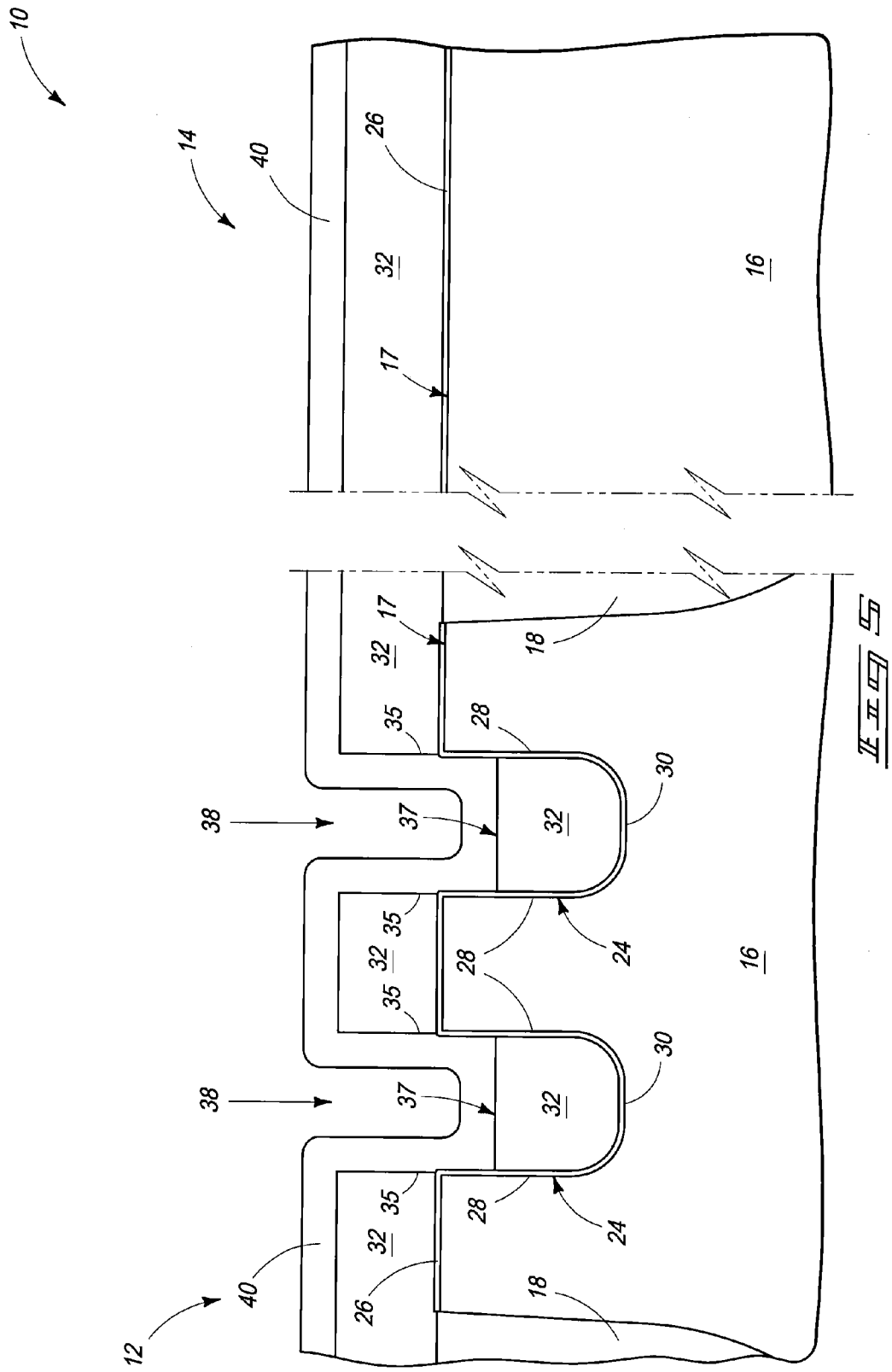
FIG. 5 is a view of the FIG. 4 substrate at a processing step subsequent to that shown by FIG. 4.

Referring to FIG. 5, photoresist-comprising material 36 (not shown) has been removed. Further in one example embodiment where an etch barrier 34 (not shown) has been used, such has also been removed from the substrate after trench openings 38 have been etched. Subsequently, spacer material 40 has been deposited over first conductive gate material 32, including within trench openings 38 over material 32 within recessed access device trenches 24. In one embodiment, material 40 is dielectric. Material 40 may be homogenous or non-homogenous, and regardless may be of the same composition or different composition from that of gate dielectric 26.

Figure 6:
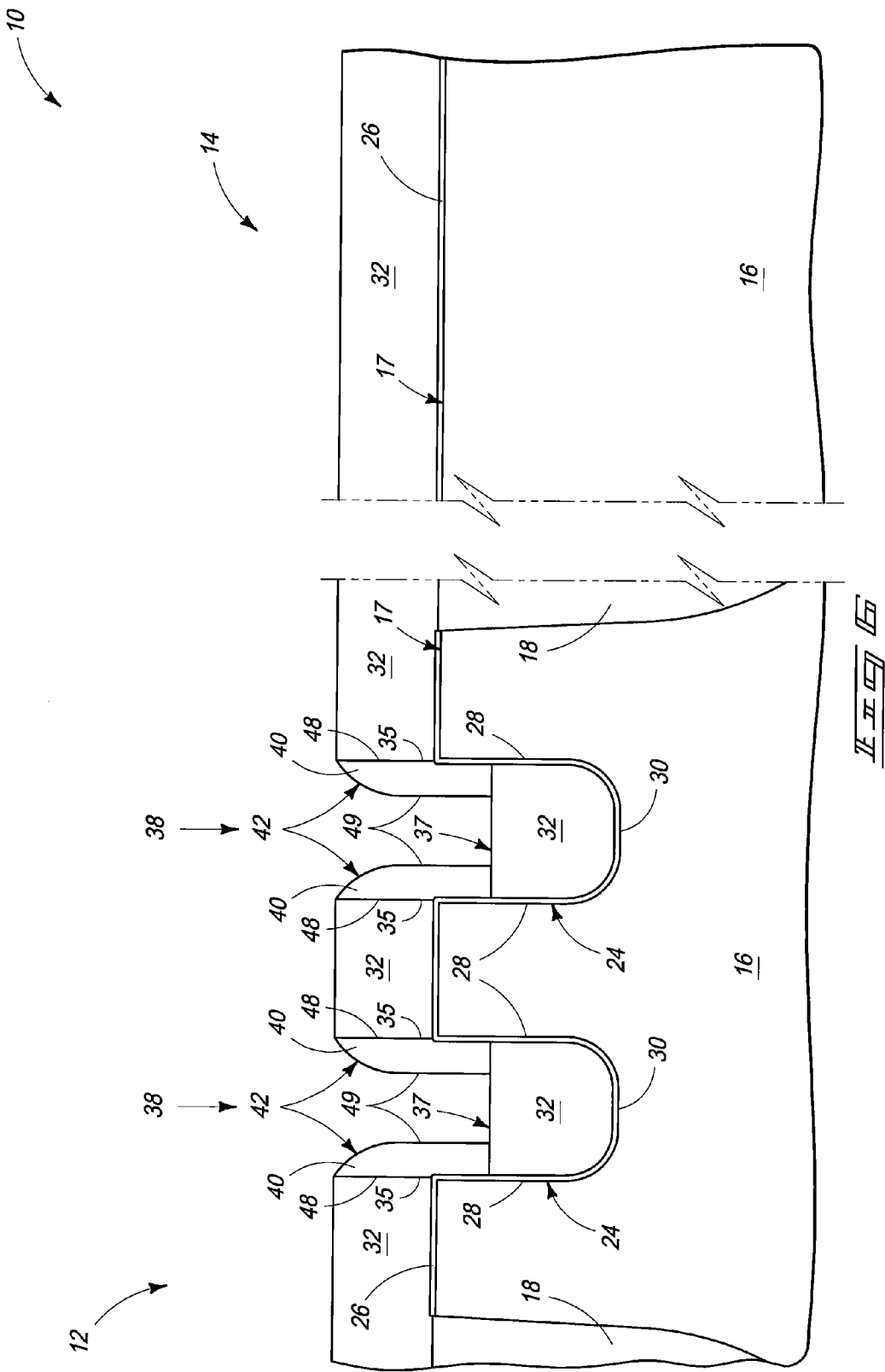
FIG. 6 is a view of the FIG. 5 substrate at a processing step subsequent to that shown by FIG. 5.

Referring to FIG. 6, anisotropically etched sidewall spacers 42 have been formed from material 40. Such may be received laterally over the opposing sidewalls of the exposed portions of gate dielectric 26 that are within semiconductive material trenches 24. Such may also be received laterally over opposing sidewalls 35 of first conductive gate material 32 of trench openings 38. Spacers 42 may be formed to be wider at their bottoms/bases than at their tops, for example as shown. Such describes and depicts but one method of forming a pair of sidewall spacers laterally over opposing sidewalls of a gate dielectric and elevationally over first conductive gate material. Alternate etching or growth techniques may be used. A pair of spacers may be interconnected within one or both opposing ends of a trench, but regardless may be considered as a pair of spacers in at least one straight line cross section, for example as shown. Further, the spacers may or may not be dielectric. Spacers 42 may be considered as having laterally outermost sidewall surfaces 48 and laterally innermost sidewall surfaces 49.

Figure 7:
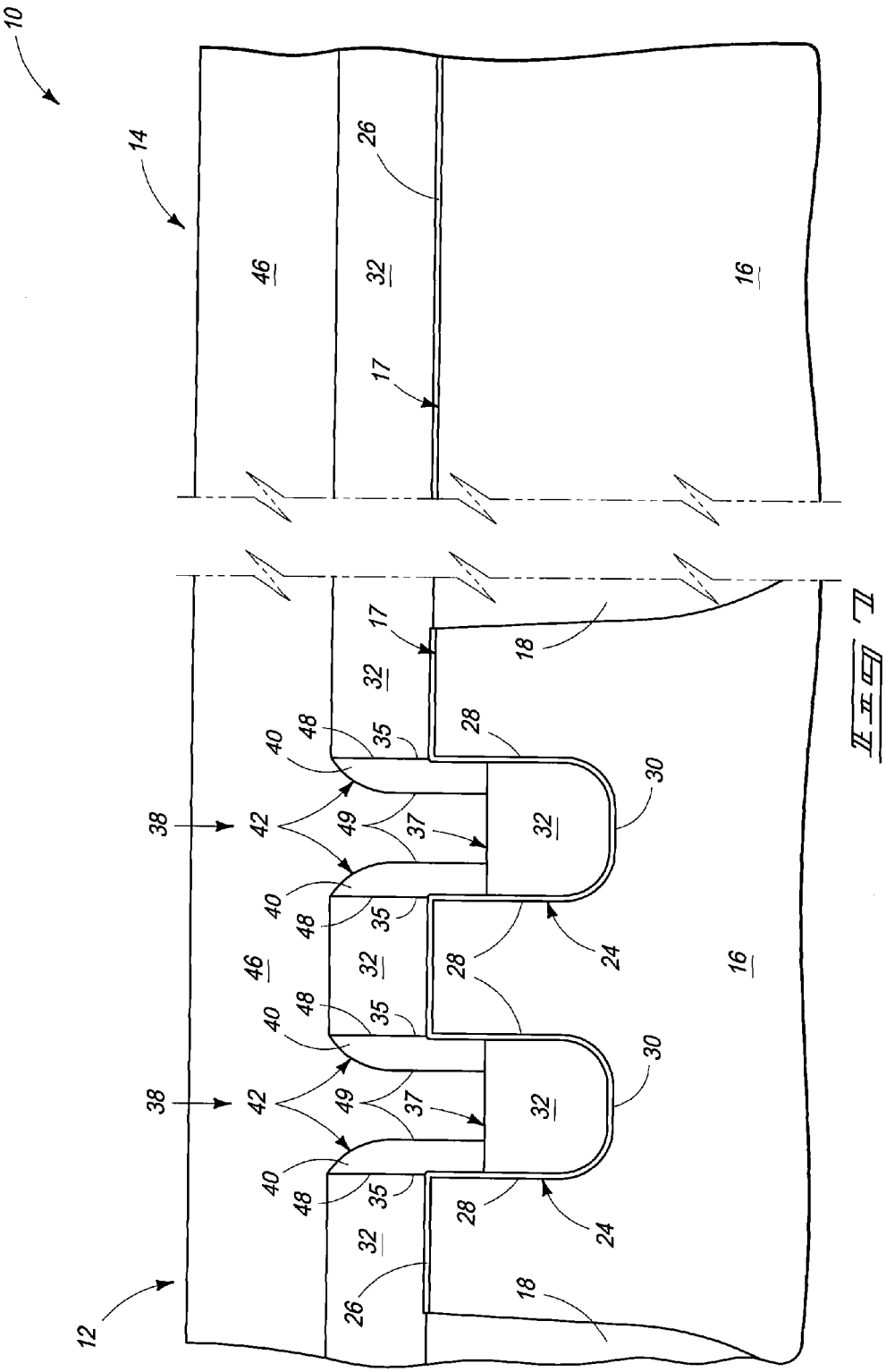
FIG. 7 is a view of the FIG. 6 substrate at a processing step subsequent to that shown by FIG. 6.

Referring to FIG. 7, second conductive gate material 46 has been deposited within semiconductive material trenches 24 between the respective pairs of sidewall spacers 42 and may physically contact and be in electrical connection with first conductive gate material 32 in memory array area 12. Second conductive gate material 46 has also been formed over and may physically contact and be in electrical connection with first conductive gate material 32 in peripheral circuitry area 14. Second conductive gate material 46 may be homogenous or non-homogenous, may or may not be of the same composition as first gate material 32, and may be deposited to any suitable thickness. In some embodiments, second conductive gate material 46 may not be deposited into physical contact with first conductive gate material 32. In one embodiment, second conductive gate material 46 may be deposited above spacers 42. In other words, embodiments of the invention contemplate second conductive material 46 not being deposited or remaining in a finished circuitry construction with spacers 42. Additionally, other material (not shown) may be deposited over second conductive gate material 46. As an example, an insulator (not shown) such as silicon nitride may be deposited over gate material 46 to be used in the fabrication of insulative gate caps.

Figure 8:
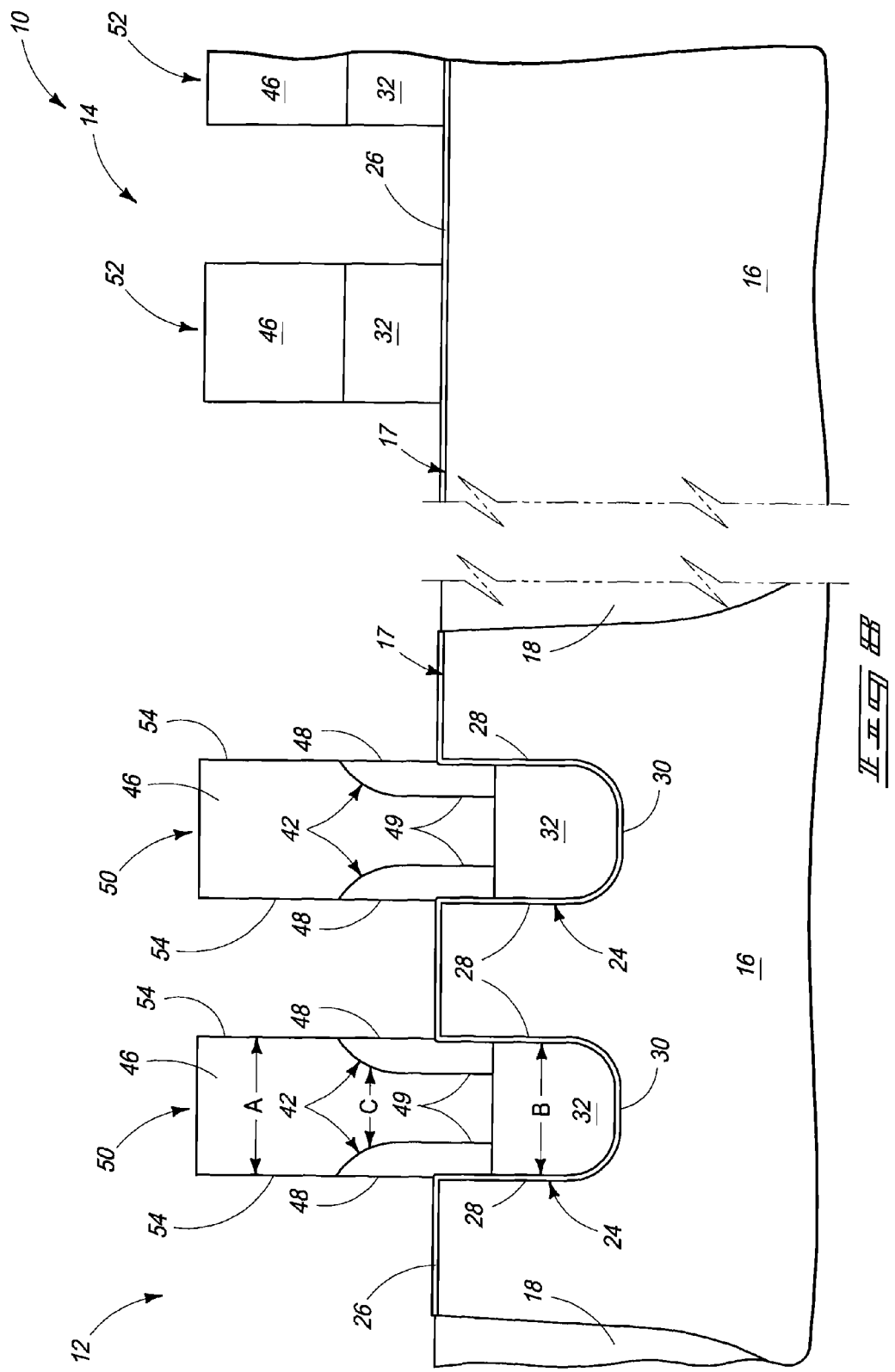
FIG. 8 is a view of the FIG. 7 substrate at a processing step subsequent to that shown by FIG. 7.

Referring to FIG. 8, and in a single masking step, second conductive gate material 46 within memory array area 12 has been etched or otherwise removed to form recessed access device gate constructions 50 within memory array area 12. Similarly, first and second conductive gate materials 32, 46 have been etched or otherwise removed within peripheral circuitry area 14 to form peripheral circuitry gate constructions 52. Such masking step may comprise, by way of example, deposition and patterning of a photosensitive material (not shown) to comprise masking blocks (not shown) of the same lateral and longitudinal configuration of the elevationally outermost portions of gate constructions 50 and 52. Some or all of gate dielectric 26 may or may not (as shown) be removed laterally outward of gate constructions 50 and/or gate constructions 52. In one embodiment, the patterning of second conductive gate material 46 forms the respective conductive portions of gate constructions 50 to be wider in cross section above and below dielectric spacers 42 than therebetween. For example, the conductive portion of a gate construction 50 in the depicted example is encompassed by the combination of first conductive gate material 32 and second conductive gate material 46. Such conductive portion has a greater or wider upper lateral expanse A above dielectric spacers 42 and a greater or wider lateral expanse B below dielectric spacers 42 than every portion of lateral expanse C between dielectric spacers 42. Regardless, in one embodiment, the patterning may form second conductive gate material 46 to have laterally outermost sidewall surfaces 54 that are laterally coincident with those surfaces 48 of dielectric spacers 42. Provision of dielectric spacers 42 results in an effective widening of the gate dielectric region for the transistor at the locations where the outermost surfaces of material 16 join or define trenches 24. Such may reduce GIDL in circuit operation.

Figure 9:
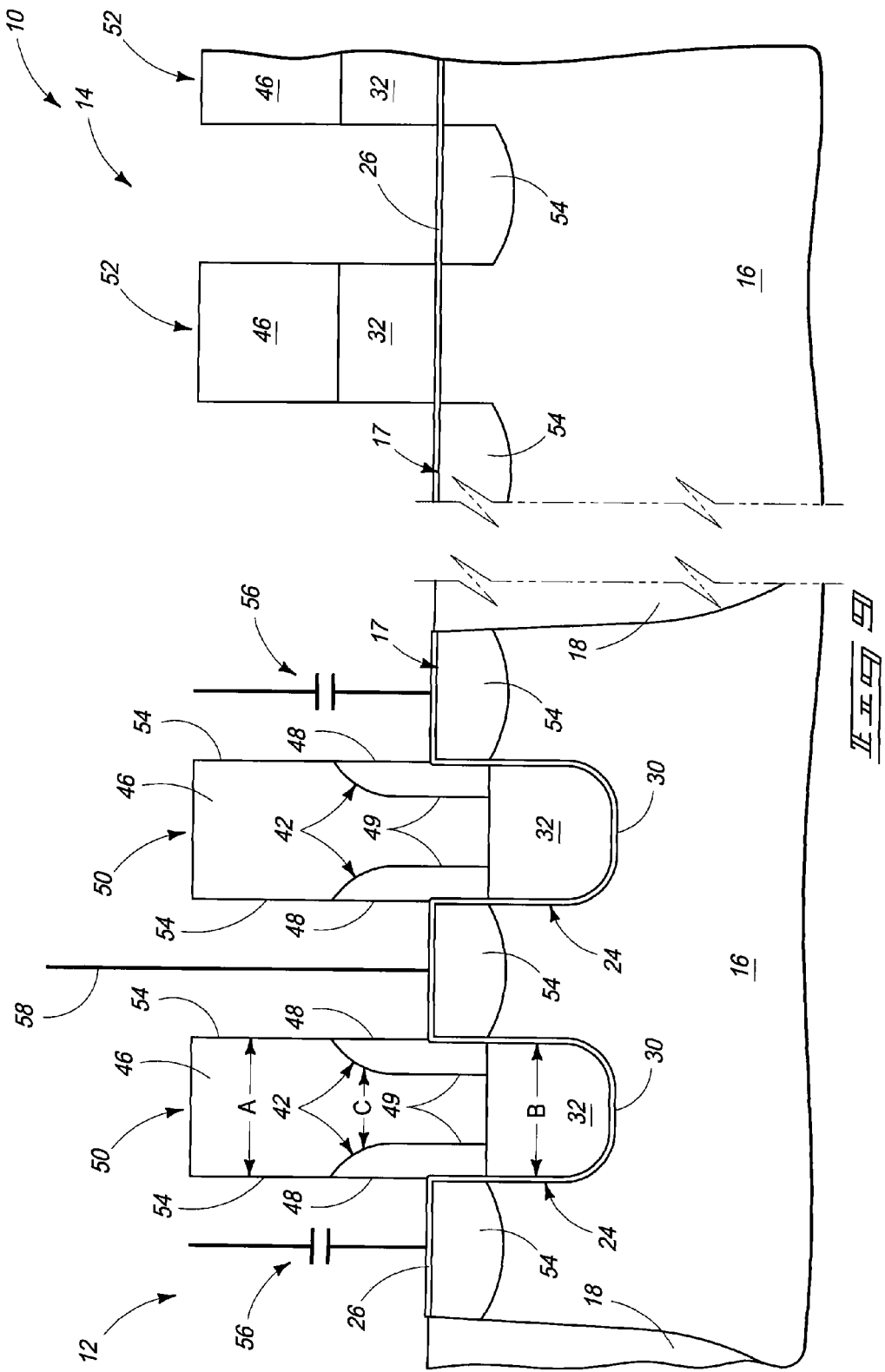
FIG. 9 is a view of the FIG. 8 substrate at a processing step subsequent to that shown by FIG. 8.

Processing may proceed subsequently in fabrication of completed field effect transistor devices using recessed access gate constructions 50 within memory array area 12 and gate constructions 52 within peripheral circuitry area 14. For example as shown in FIG. 9, suitable source/drain regions 54 have been fabricated in memory array area 12 and peripheral circuitry area 14. In one example embodiment, two recessed access device transistors in memory array area 12 are shown as comprising part of DRAM circuitry. A center and shared source/drain region 54 of the two transistors is shown connected schematically with a data/sense line 58 (for example a bit line), while the laterally outer source/drain regions 54 are shown connected schematically with a respective capacitor 56, thus forming two memory cells of DRAM circuitry.

Example alternate embodiments of a method of forming recessed access device gate constructions within a memory array area and peripheral circuitry gate constructions in a peripheral circuitry area are next described with reference to FIGS. 10-17. Like numerals from the above-described embodiments have been used where appropriate, with some construction differences being indicated with the suffix "a" or with different numerals.

Figure 10:
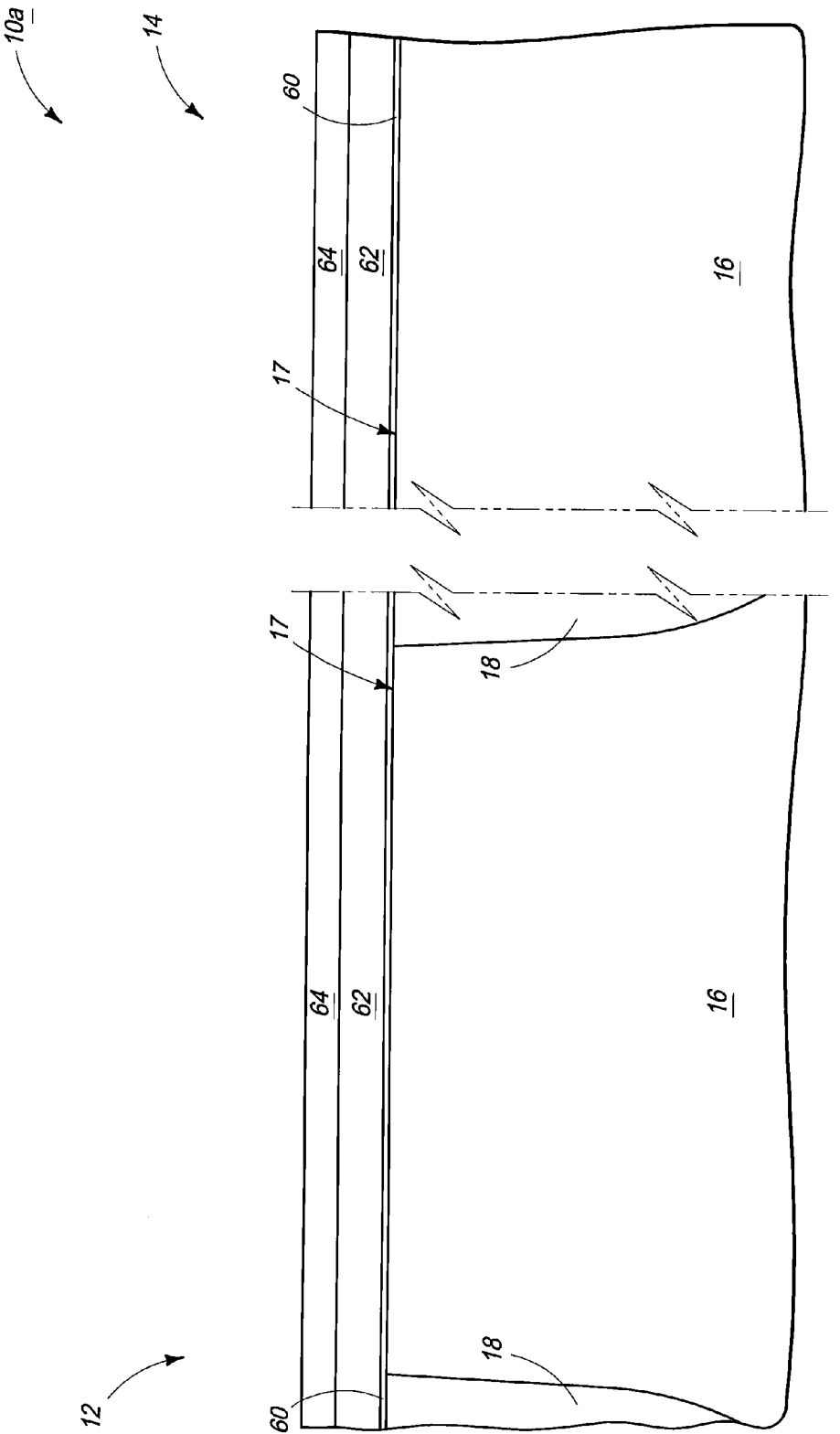
FIG. 10 is a diagrammatic sectional view of a substrate fragment in process in accordance with an embodiment of the invention.

Referring to FIG. 10, peripheral circuitry gate dielectric 60 and conductive peripheral circuitry gate material 62 have been formed over peripheral circuitry area 14 and over memory array area 12 of semiconductor substrate 10a. Attributes of dielectric material 60 may be as described above with respect to gate dielectric 26. Example conductive peripheral circuitry gate material 62 may be as described above with respect to first and second conductive gate materials 32, 46. In one embodiment and as shown, an oxidation barrier 64 may be formed over conductive peripheral gate material 62 in memory array area 12 and in peripheral circuitry area 14. An example material is silicon nitride deposited to an example thickness of about 300 Angstroms.

Figure 11:
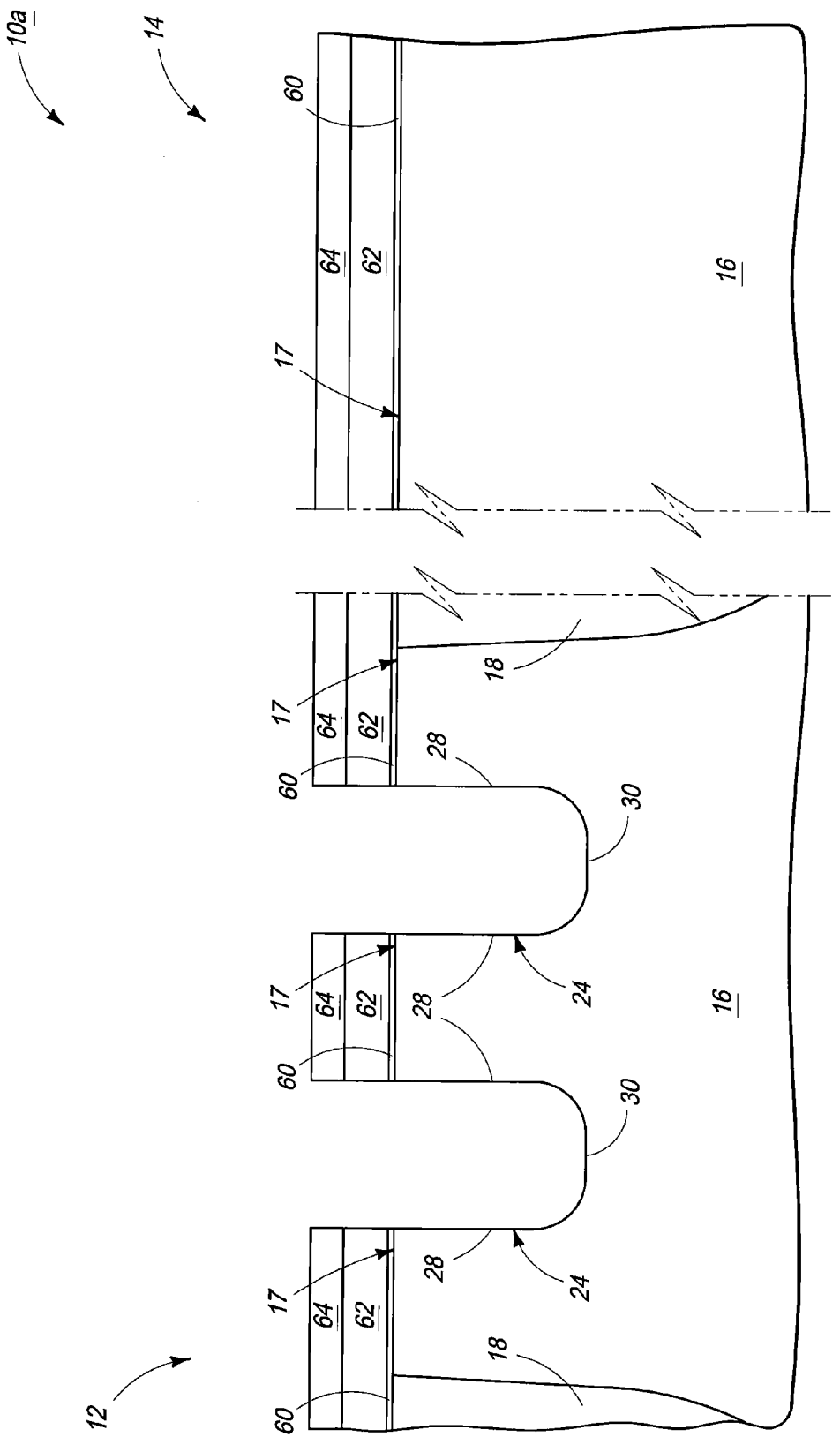
FIG. 11 is a view of the FIG. 10 substrate at a processing step subsequent to that shown by FIG. 10.

Referring to FIG. 11, recessed access device trenches 24 have been etched to within semiconductive material 16 by etching through material 64, 62 and 60. Such may be formed using photolithographic or other method.

Figure 12:
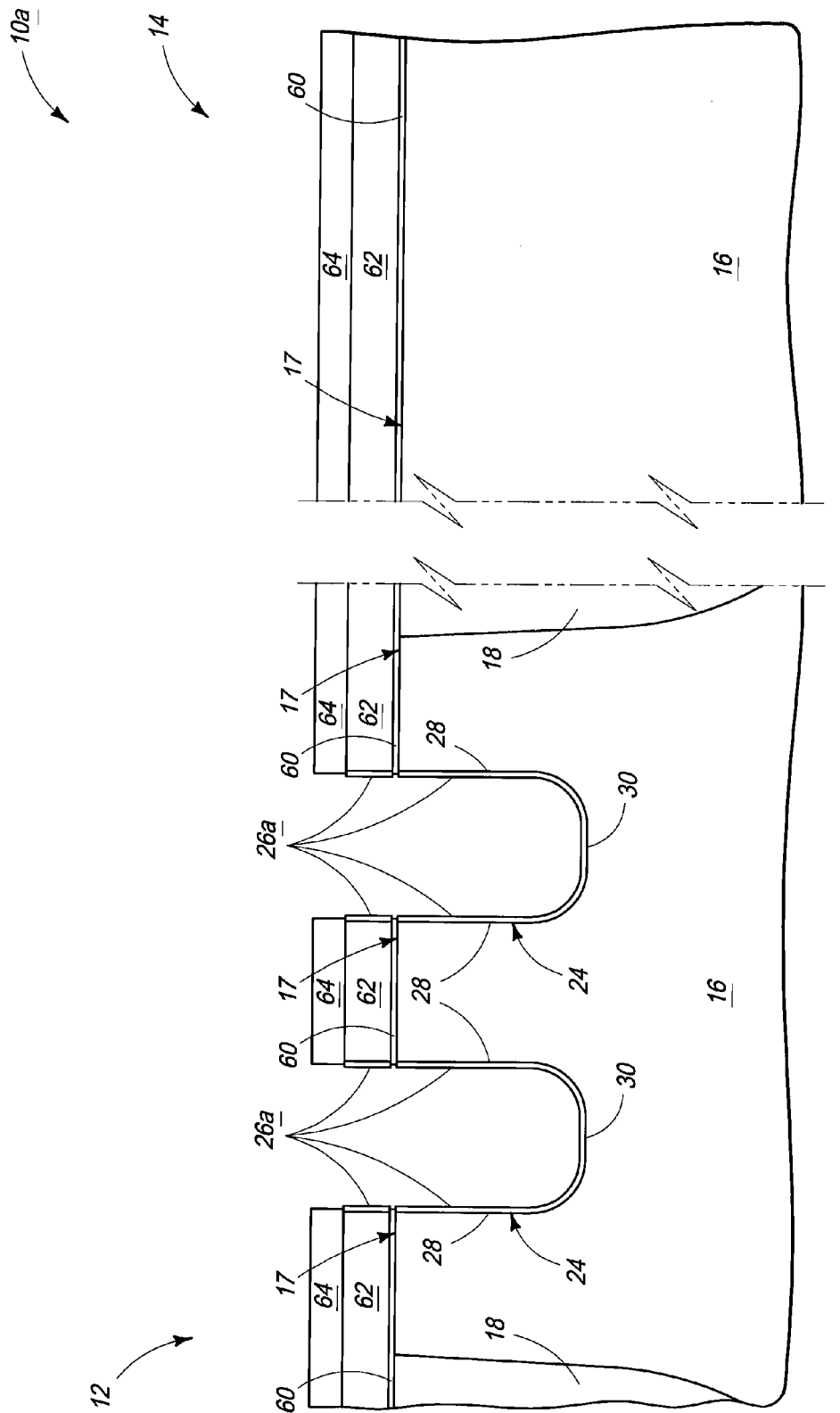
FIG. 12 is a view of the FIG. 11 substrate at a processing step subsequent to that shown by FIG. 11.

Referring to FIG. 12, memory array gate dielectric 26a has been formed over sidewalls 28 of semiconductive material 16 within trenches 24 in memory array area 12. Such may be formed by any suitable method and have any of the attributes of dielectric 26 described above. If formed by oxidation and where conductive peripheral circuitry gate material 62 comprises an oxidizable material, such may also form laterally over sidewalls of such material above semiconductive material trenches 24, as shown.

Figure 13:
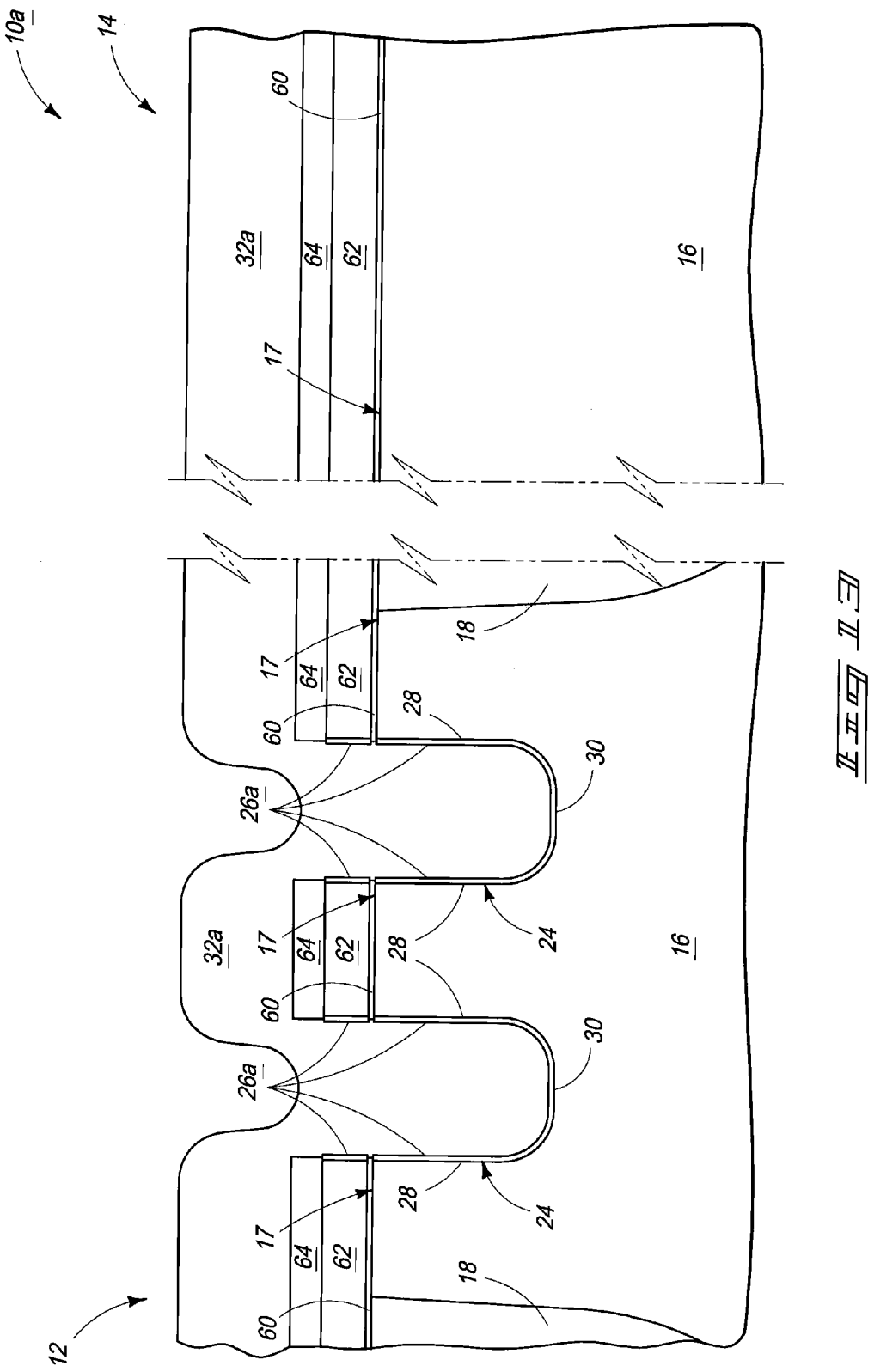
FIG. 13 is a view of the FIG. 12 substrate at a processing step subsequent to that shown by FIG. 12.

Referring to FIG. 13, first conductive gate material 32a has been deposited over a memory array gate dielectric 26a within semiconductive material trenches 24 in memory array area 12 and over peripheral circuitry area 14. Such may have any one or more of the attributes described above with respect to first conductive gate material 32.

Figure 14:
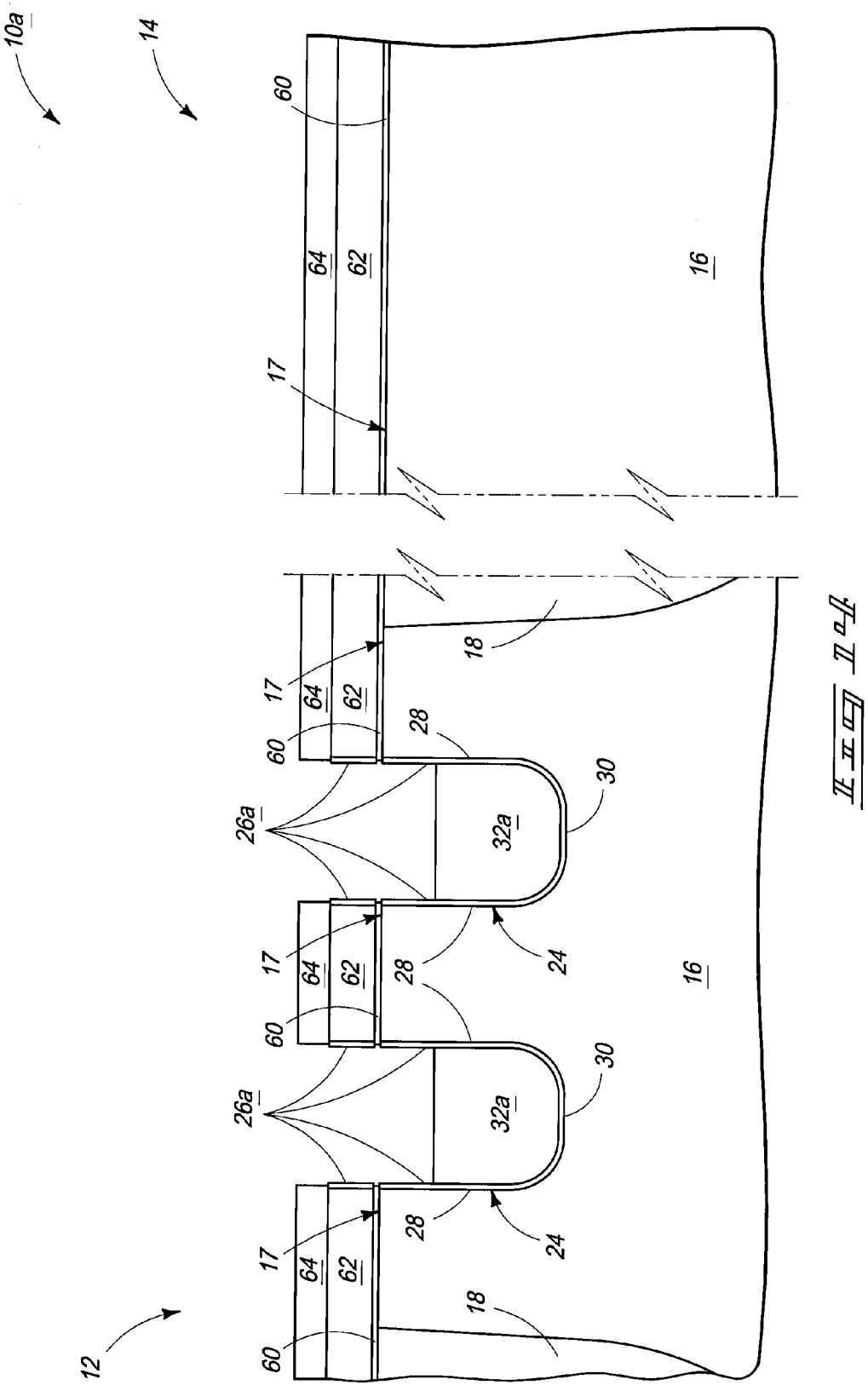
FIG. 14 is a view of the FIG. 13 substrate at a processing step subsequent to that shown by FIG. 13.

Referring to FIG. 14, first conductive gate material 32a has been etched to recess it within trenches 24 to below surfaces 17 of semiconductive material 16 adjacent trenches 24 within memory array area 12. Further, opposing sidewalls of a portion of memory array gate dielectric 26a within trenches 24 have been exposed. Any one or more attributes as described above with respect to the processing of FIG. 4 may be used in the processing of FIG. 14.

Figure 15:
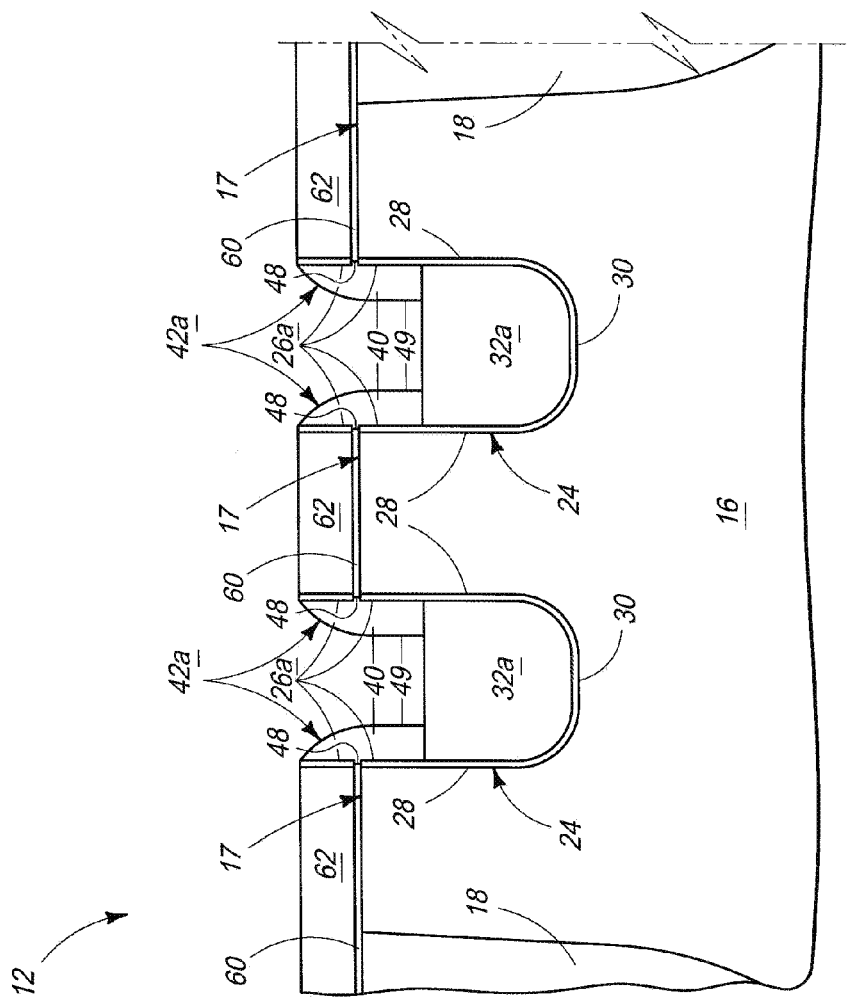
FIG. 15 is a view of the FIG. 14 substrate at a processing step subsequent to that shown by FIG. 14.

Referring to FIG. 15 an in one embodiment where an oxidation barrier 64 (not shown) has been used, such may be removed from the substrate. Subsequently, respective pairs of etched sidewall spacers 42a have been formed within memory array area 12 from deposited material 40. Such may be formed, for example, as described above in connection with the processing of FIG. 7. Regardless, in FIG. 15, spacers 42a are shown as being received laterally over the exposed portions of memory array gate dielectric 26a within trenches 24 below surfaces 17 of semiconductive material 16 adjacent trenches 24. Such are also received laterally over opposing sidewalls of peripheral circuitry gate dielectric 60 above surfaces 17 of semiconductive material 16. Further, spacers 42a are also received laterally over opposing sidewalls of conductive peripheral circuitry gate material 62 above surfaces 17 of semiconductive material 16 adjacent trenches 24. In one embodiment as shown where dielectric material 26a is also formed over sidewalls of material 62, material 26a is received between spacers 42a and material 62.

Figure 16:
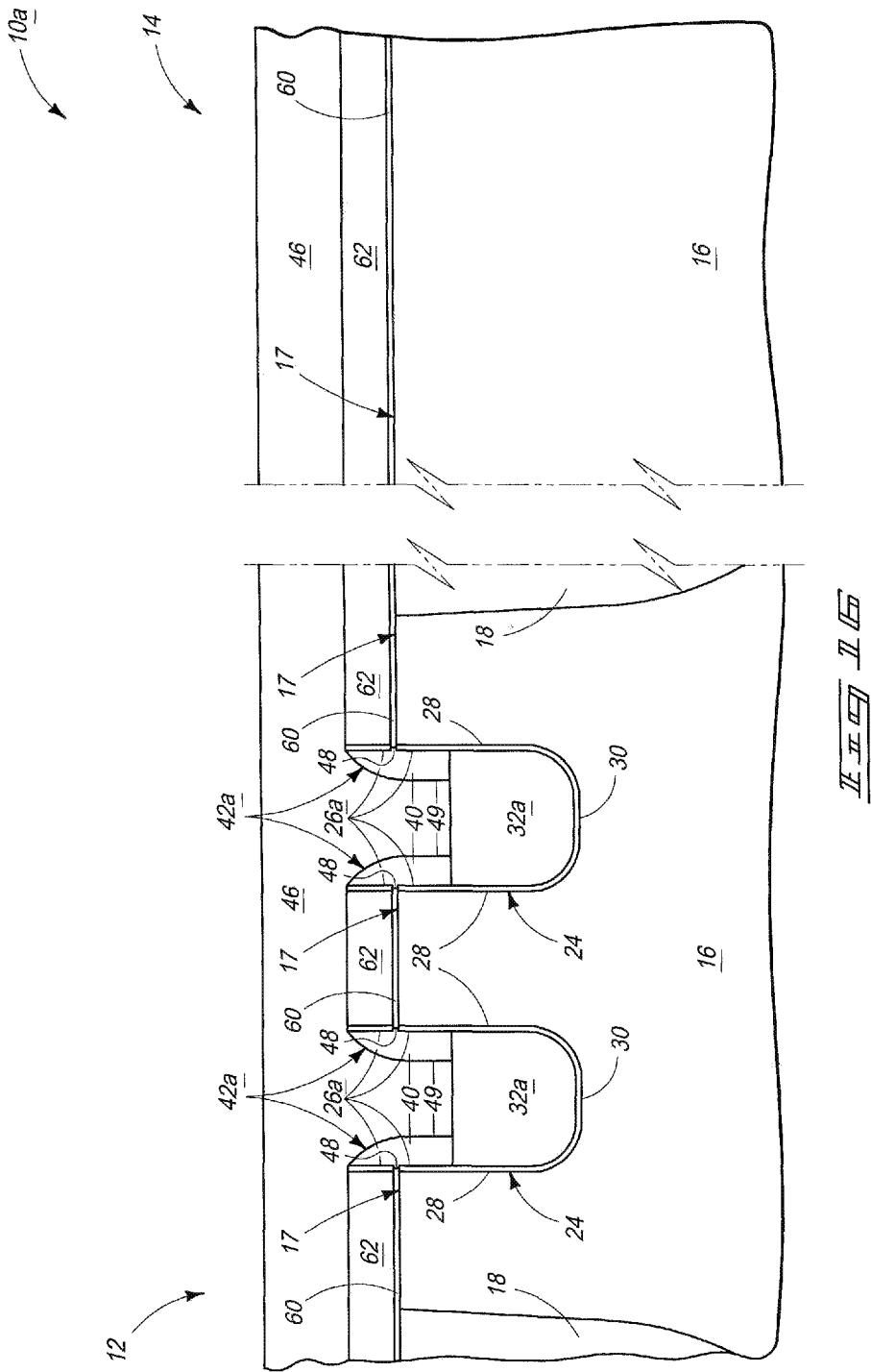
FIG. 16 is a view of the FIG. 15 substrate at a processing step subsequent to that shown by FIG. 15.

Referring to FIG. 16, second conductive gate material 46 has been deposited within trenches 24 between the respective pairs of spacers 42a in electrical connection with first conductive gate material 32a within memory array area 12. Such has also been deposited over and in electrical connection with conductive peripheral circuitry gate material 62 in peripheral circuitry area 14. Any one or more of the attributes described above may be used or result.

Figure 17:
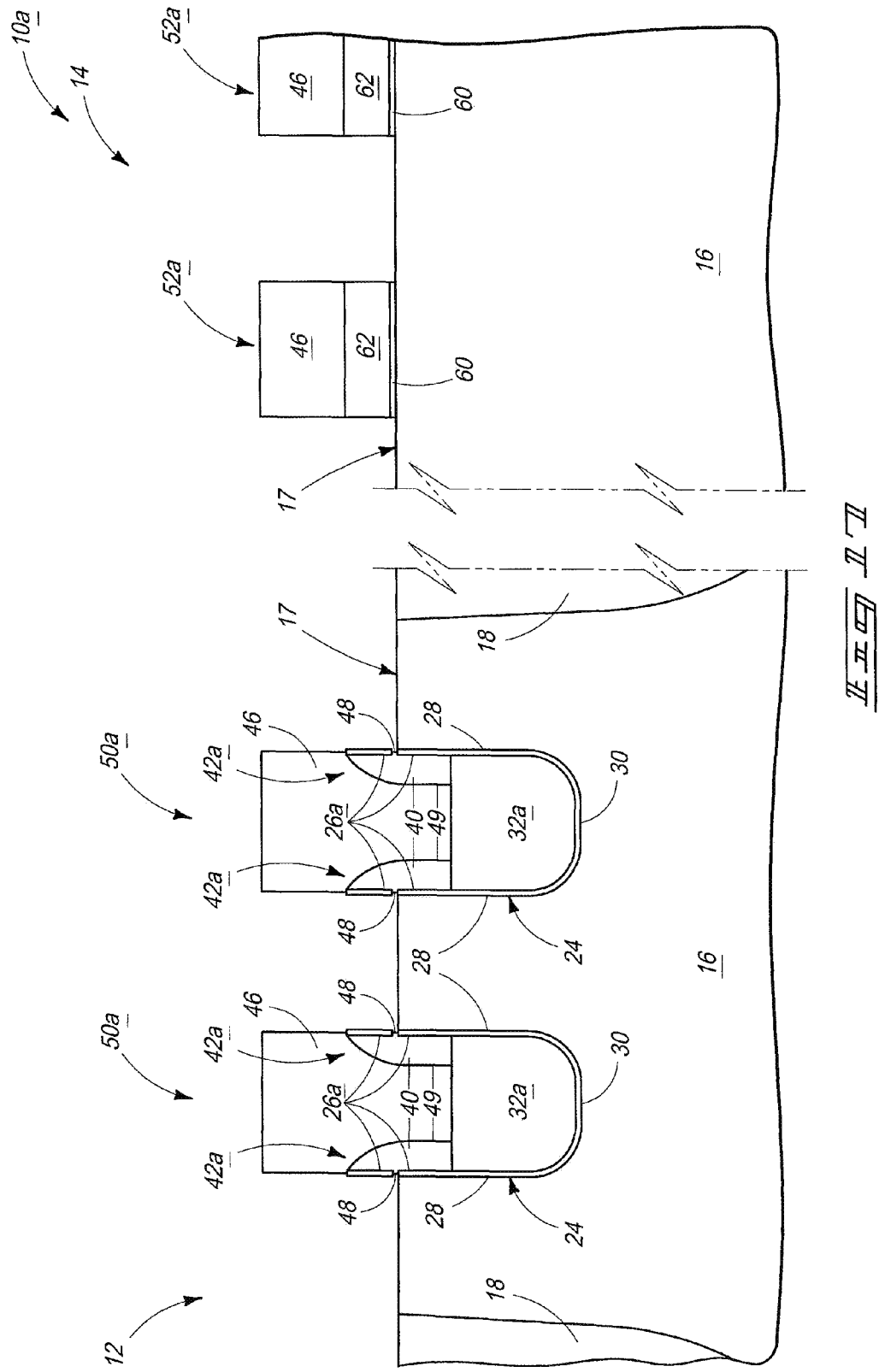
FIG. 17 is a view of the FIG. 16 substrate at a processing step subsequent to that shown by FIG. 16.

Referring to FIG. 17, and in a single masking step, second conductive gate material 46 within memory array area 12 has been etched or otherwise removed to form recessed access device gate constructions 50a within memory array area 12. Similarly, second conductive gate material 46 and conductive peripheral circuitry gate material 62 have been etched or otherwise removed within peripheral circuitry area 14 to form peripheral circuitry gate constructions 52a. Some or all of peripheral circuitry gate dielectric 60 may (as shown) or may not be removed laterally outward of gate constructions 50a and/or gate constructions 52a. Any attribute and/or subsequent processing may occur or result as described above, or otherwise.

In one embodiment of the invention, a method of forming a gate construction of a recessed access device includes forming a pair of sidewall spacers laterally over opposing sidewalls of a gate dielectric and above first conductive gate material. The gate dielectric, the first conductive gate material, and the spacers over which such are formed are collectively received within a trench formed in semiconductive material. Such spacers may or may not project outwardly of the semiconductive material in which the trench is formed. Further, other material may or may not be received over the semiconductive material in which the trench is formed. The above-described embodiments show spacers 42 and 42a as projecting elevationally outward of a trench 24 in semiconductive material 16. Alternately and by way of example, such spacers might have uppermost surfaces which are elevationally coincident with uppermost surfaces 17 of material 16 immediately adjacent a trench 24, or which are recessed within a trench 24 below such surfaces 17. However, greater reduction in GIDL may occur by having dielectric spacers 42/42a project elevationally outward of material 16 as shown.

Regardless, second conductive gate material is deposited within the semiconductive material trench between the pair of sidewall spacers to be in electrical connection with the first conductive gate material. One or more attributes may be as described above with respect to composition, deposition, and any subsequent patterning with respect to the first and second conductive gate materials.

In one embodiment of the invention, a method of forming a gate construction of a recessed access device comprises forming gate dielectric and first conductive gate material within a trench in semiconductive material. The first conductive gate material is recessed, for example by etching, within the trench to have an elevationally outermost (upper) surface that spans completely across the trench between the gate dielectric. A pair of etched sidewall spacers is formed within the trench laterally over opposing sidewalls of the gate dielectric and over the first conductive gate material. Second conductive gate material is deposited within the trench between the pair of etched sidewall spacers in electrical connection with the first conductive gate material.

Embodiments of the invention also encompass recessed access device gate constructions independent of method of fabrication. In one embodiment, such a gate construction comprises a trench within semiconductive material, with the trench comprising semiconductive material sidewalls and a semiconductive material base extending between the semiconductive material sidewalls. A gate dielectric lining is received over the semiconductive material trench sidewalls and the semiconductive material trench base. A pair of laterally spaced and laterally opposed blocks is received within an upper portion of the trench, and which project laterally into the trench. The above-described sidewall spacers are example such blocks. Regardless, the blocks are laterally thicker than thickness of the gate dielectric lining that is received over the trench sidewalls and the trench base. Conductive gate material is received within the trench between and below the blocks, and extends elevationally outward of the semiconductive material trench to elevationally over the dielectric blocks.

In one embodiment, the conductive portion of the gate construction is wider in cross section above and below the blocks than there-between. Any one or other attributes of the constructions as described above and/or shown in the drawings may constitute an attribute of such a recessed access device gate construction.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a gate construction of a recessed access device, comprising:
    forming a pair of non-dielectric sidewall spacers laterally over opposing sidewalls of a gate dielectric and elevationally over first conductive gate material; the gate dielectric, the first conductive gate material, and the sidewall spacers being within a trench formed in semiconductive material, the sidewall spacers projecting elevationally outward of the semiconductive material in which the trench is formed and projecting elevationally outward of the gate dielectric; and
    depositing second conductive gate material within the semiconductive material trench between the pair of sidewall spacers in electrical connection with the first conductive gate material.

2. The method of claim 1 wherein the sidewall spacers are formed by anisotropic etching.

3. The method of claim 1 wherein the first and second conductive gate materials are of the same composition.

4. The method of claim 1 wherein the second conductive gate material is deposited into physical contact with the first conductive gate material that is within the trench.

5. The method of claim 1 wherein the spacers project laterally from the semiconductive material in which the trench is formed.

6. The method of claim 1 comprising:
    depositing the second conductive gate material over the pair of spacers; and
    patterning the second conductive gate material such that the conductive portion of the gate construction is wider in cross section above and below the spacers than there-between.

7. The method of claim 1 wherein the first conductive gate material has a planar surface that spans completely across the trench between the gate dielectric.

8. The method of claim 1 wherein the spacers are formed to be wider at their bottoms than at their tops.

9. The method of claim 1 wherein the first conductive gate material has an upper surface within the trench and the semiconductive material has an upper surface adjacent the trench, the upper surface of the first conductive gate material being recessed from about 200 Angstroms to about 500 Angstroms from the upper surface of the semiconductive material adjacent the trench.

10. A method of forming a gate construction of a recessed access device, comprising:
    forming gate dielectric within a trench in semiconductive material;
    forming first conductive gate material within the trench over the gate dielectric within the trench and elevationally over the semiconductive material laterally outward of the trench in the semiconductive material;
    recessing the first conductive gate material within the trench to have an upper surface that spans completely across the trench between the gate dielectric elevationally inward of the elevationally outermost surface of the semiconductive material, the first conductive gate material after the recessing having opposing sidewalls elevationally outward of the semiconductive material, that portion of the first conductive gate material that is within the trench having an outer surface that is elevationally within the trench in the semiconductive material prior to starting the recessing;
    forming a pair of etched sidewall spacers within the trench laterally over opposing sidewalls of the gate dielectric and above the recessed first conductive gate material, the sidewall spacers being laterally over the opposing sidewalls of the first conductive gate material that are elevationally outward of the semiconductive material; and
    depositing second conductive gate material within the trench between the pair of etched sidewall spacers in electrical connection with the first conductive gate material.

11. The method of claim 10 wherein the upper surface of the first conductive gate material within the trench is planar.

12. The method of claim 10 wherein the recessing comprises etching the first conductive gate material.

13. The method of claim 10 comprising:
    depositing the second conductive gate material over the pair of etched spacers; and patterning the second conductive gate material such that the conductive portion of the gate construction is wider in cross section above and below the etched spacers than there-between.

14. A method of forming recessed access device gate constructions within a memory array area and peripheral circuitry gate constructions in a peripheral circuitry area, comprising:
forming recessed access device trenches within semiconductive material within a memory array area of a semiconductor substrate;
forming gate dielectric over sidewalls of the semiconductive material within the trenches in the memory array area and over semiconductive material within a peripheral circuitry area of the semiconductor substrate;
depositing first conductive gate material over the gate dielectric within the semiconductive material trenches in the memory array area and over the gate dielectric in the peripheral circuitry area;
etching trench openings through the first conductive gate material over the recessed access device trenches within the memory array area and exposing portions of the gate dielectric within the semiconductive material trenches in the memory array area, the first conductive gate material after the etching having opposing sidewalls elevationally outward of the semiconductive material;
in the memory array area, forming sidewall spacers that are laterally over the exposed portions of the gate dielectric within the semiconductive material trenches and that are laterally over opposing sidewalls of the first conductive gate material of the trench openings, the sidewall spacers being laterally over the opposing sidewalls of the first conductive gate material that are elevationally outward of the semiconductive material;
depositing second conductive gate material within the semiconductive material trenches between the sidewall spacers and in electrical connection with the first conductive gate material in the memory array area and over and in electrical connection with the first conductive material in the peripheral circuitry area; and
in a single masking step, removing the second conductive gate material within the memory array area to form recessed access device gate constructions within the memory array area and removing the first and second conductive gate materials within the peripheral circuitry area to form peripheral circuitry gate constructions.

15. A method of forming recessed access device gate constructions within a memory array area and peripheral circuitry gate constructions in a peripheral circuitry area, comprising:
forming recessed access device trenches within semiconductive material within a memory array area of a semiconductor substrate;
forming gate dielectric over sidewalls of the semiconductive material within the trenches in the memory array area and over semiconductive material within a peripheral circuitry area of the semiconductor substrate;
depositing first conductive gate material over the gate dielectric within the semiconductive material trenches in the memory array area and over the gate dielectric in the peripheral circuitry area;
etching trench openings through the first conductive gate material over the recessed access device trenches within the memory array area and exposing portions of the gate dielectric within the semiconductive material trenches in the memory array area;

in the memory array area, forming sidewall spacers that are laterally over the exposed portions of the gate dielectric within the semiconductive material trenches and that are laterally over opposing sidewalls of the first conductive gate material of the trench openings;
depositing second conductive gate material within the semiconductive material trenches between the sidewall spacers and in electrical connection with the first conductive gate material in the memory array area and over and in electrical connection with the first conductive material in the peripheral circuitry area; and
in a single masking step, removing the second conductive gate material within the memory array area to form recessed access device gate constructions within the memory array area and removing the first and second conductive gate materials within the peripheral circuitry area to form peripheral circuitry gate constructions;
forming a photoresist-comprising mask which is used when etching the trench openings; and
depositing an etch barrier over the first conductive gate material in the memory array area and in the peripheral circuitry area prior to forming the photoresist-comprising mask.

16. The method of claim 15 comprising removing the etch barrier from the semiconductor substrate after etching the trench openings.

17. The method of claim 16 comprising removing the etch barrier from the semiconductor substrate before forming the sidewall spacers.

18. The method of claim 14 comprising:
depositing the second conductive gate material over the spacers; and
patterning the second conductive gate material such that the respective conductive portions of the recessed access device gate constructions are wider in cross section above and below the spacers than there-between.

19. The method of claim 18 wherein the sidewall spacers have lateral sidewall surfaces, the patterning forming the second conductive gate material of the recessed access device gate constructions to have sidewall surfaces that are laterally coincident with those of the sidewall spacers.

20. A method of forming a gate construction of a recessed access device, comprising:
forming a pair of non-dielectric sidewall spacers laterally over opposing sidewalls of a gate dielectric and elevationally over first conductive gate material; the gate dielectric, the first conductive gate material, and the sidewall spacers being within a trench formed in semiconductive material; and
depositing second conductive gate material within the semiconductive material trench between the pair of sidewall spacers in electrical connection with the first conductive gate material.

21. A method of forming a gate construction of a recessed access device, comprising:
forming gate dielectric and first conductive gate material within a trench in semiconductive material;
recessing the first conductive gate material within the trench to have an upper surface that spans completely across the trench between the gate dielectric elevationally inward of the elevationally outermost surface of the semiconductive material, that portion of the first conductive gate material that is within the trench having an outer surface that is elevationally within the trench in the semiconductive material prior to starting the recessing;

forming a pair of etched sidewall spacers within the trench laterally over opposing sidewalls of the gate dielectric and above the recessed first conductive gate material; and depositing second conductive gate material within the trench between the pair of etched sidewall spacers in electrical connection with the first conductive gate material.

* * * * *